(12) United States Patent
Reznicek et al.

(10) Patent No.: US 11,329,142 B2
(45) Date of Patent: May 10, 2022

(54) VERTICAL TRANSISTOR WITH BODY CONTACT

(71) Applicant: International Business Machines Corporation, Armonk, NY (US)

(72) Inventors: Alexander Reznicek, Troy, NY (US); Tak H. Ning, Yorktown Heights, NY (US); Bahman Hekmatshoartabari, White Plains, NY (US); Jeng-Bang Yau, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 27 days.

(21) Appl. No.: 17/132,576

(22) Filed: Dec. 23, 2020

(65) Prior Publication Data

US 2021/0119018 A1 Apr. 22, 2021

Related U.S. Application Data

(62) Division of application No. 16/284,422, filed on Feb. 25, 2019, now Pat. No. 10,869,671.

(51) Int. Cl.
*H01L 29/66* (2006.01)
*H01L 21/28* (2006.01)
*H01L 29/78* (2006.01)

(52) U.S. Cl.
CPC .. *H01L 29/66666* (2013.01); *H01L 21/28123* (2013.01); *H01L 29/783* (2013.01); *H01L 29/7827* (2013.01)

(58) Field of Classification Search
CPC ........... H01L 29/66666; H01L 29/7827; H01L 29/783; H01L 21/28123
See application file for complete search history.

(56) References Cited

U.S. PATENT DOCUMENTS

| 5,804,848 A | 9/1998 | Mukai |
| 7,244,640 B2 | 7/2007 | Yang et al. |
| (Continued) | | |

OTHER PUBLICATIONS

J.B. Kuang et al., "Restoration of Controllable Hysteresis in Partially Depleted SOI CMOS Schmitt Trigger Circuits," IEEE Transactions on Circuits and Systems II: Express Briefs, Jul. 2004, pp. 349-353, vol. 51, No. 7.

(Continued)

*Primary Examiner* — Thao P Le
(74) *Attorney, Agent, or Firm* — Robert Sullivan; Ryan, Mason & Lewis, LLP

(57) ABSTRACT

A method for manufacturing a semiconductor device includes forming a fin on a semiconductor substrate, and forming a bottom source/drain region adjacent a base of the fin. In the method, a dielectric layer, a work function metal layer and a first gate metal layer are sequentially deposited on the bottom source/drain region and around the fin. The dielectric layer, the work function metal layer and the first gate metal layer form a gate structure. The method also includes removing the dielectric layer, the work function metal layer and the first gate metal layer from an end portion of the fin, and depositing a second gate metal layer around the end portion of the fin in place of the removed dielectric layer, the removed work function metal layer and the removed first gate metal layer. The second gate metal layer contacts the end portion of the fin.

20 Claims, 9 Drawing Sheets

(56) References Cited

U.S. PATENT DOCUMENTS

| | | | |
|---|---|---|---|
| 7,863,122 B2 | 1/2011 | Booth, Jr. et al. | |
| 8,735,984 B2 | 5/2014 | Yin et al. | |
| 9,024,387 B2 | 5/2015 | Erickson et al. | |
| 9,224,840 B2 | 12/2015 | Flachowsky et al. | |
| 9,712,164 B2 | 7/2017 | Momiyama | |
| 10,741,663 B1 * | 8/2020 | Bao | H01L 29/4958 |
| 2006/0091463 A1 | 5/2006 | Donze et al. | |
| 2017/0323948 A1 | 11/2017 | Basker et al. | |
| 2020/0312999 A1 * | 10/2020 | Reznicek | H01L 29/66666 |
| 2020/0395467 A1 * | 12/2020 | Yu | H01L 21/324 |
| 2021/0193737 A1 * | 6/2021 | Reznicek | H01L 45/16 |
| 2021/0327759 A1 * | 10/2021 | Xie | H01L 29/7827 |

OTHER PUBLICATIONS

F. Assaderaghi et al., "A Novel Silicon-On-Insulator (SOI) MOSFET for Ultra Low Voltage Operation," IEEE Symposium on Low Power Electronics, Oct. 10-12, 1994, pp. 58-59.

A.J. Drake et al., "Evaluation of Dynamic-Threshold Logic for Low-Power VLSI Design in 0.13um PD-SOI," IFIP/IEEE International Conference on Very Large Scale Integration of System-on-Chip (VLSI-SoC), Dec. 1-3, 2003, 6 pages.

List of IBM Patents or Patent Applications Treated as Related.

\* cited by examiner

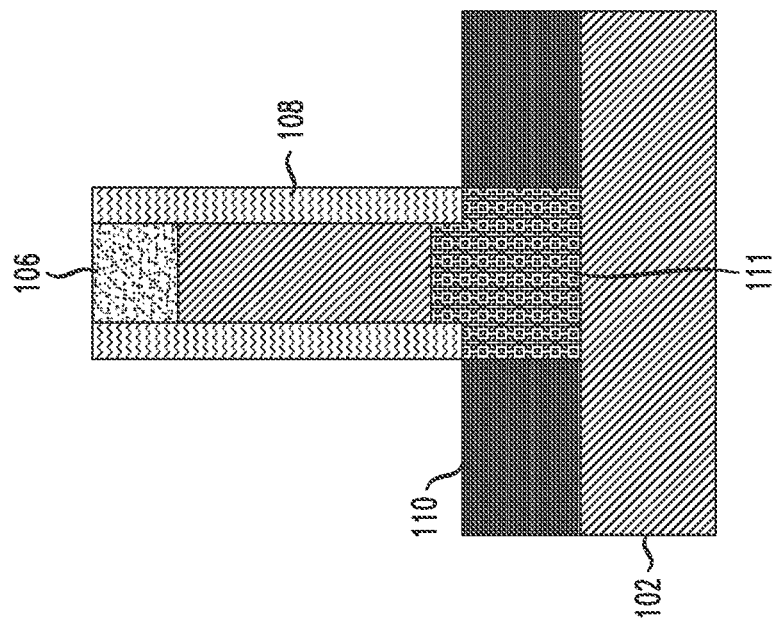
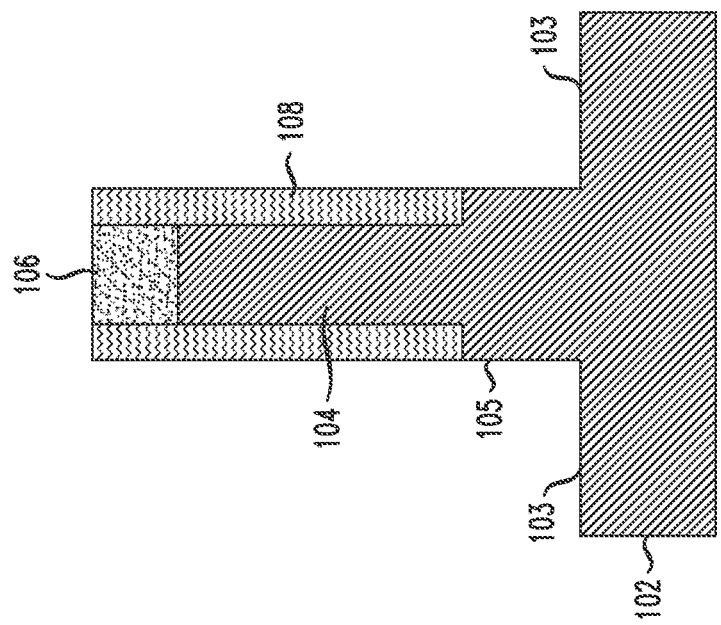

VERTICAL TRANSISTOR WITH BODY CONTACT

TECHNICAL FIELD

The field generally relates to semiconductor devices and methods of manufacturing same and, in particular, to forming vertical field effect transistors (VFETs) with dynamic threshold voltage control enabled by body contact.

BACKGROUND

Fin field-effect transistor (FinFET) devices include a transistor architecture that uses raised source-to-drain channel regions, referred to as fins. Known FinFET devices include fins with source/drain regions on lateral sides of the fins, so that current flows in a horizontal direction (e.g., parallel to a substrate) between source/drain regions at opposite ends of the fins in the horizontal direction. As horizontal devices are scaled down, there is reduced space for metal gate and source/drain contacts, which leads to degraded short-channel control and increased middle of the line (MOL) resistance.

Vertical field-effect transistors (VFETs) (also referred to as vertical transport field effect transistors (VTFETs)) are becoming viable device options for scaling semiconductor devices (e.g., complementary metal oxide semiconductor (CMOS) devices) to 5 nanometer (nm) node and beyond. VFET devices include fin channels with source/drain regions at ends of the fin channels on top and bottom sides of the fins. Current runs through the fin channels in a vertical direction (e.g., perpendicular to a substrate), for example, from a bottom source/drain region to a top source/drain region.

In order to meet target device operation requirements for VFETs, such as, for example, lower threshold voltage ($V_T$) for high-performance operations, conventional methods integrate gate metals with different work functions to control threshold voltage. However, conventional techniques undesirably result in increased device areas, floating-body effects, and increased current leakage.

SUMMARY

According to an exemplary embodiment of the present invention, a method for manufacturing a semiconductor device includes forming a fin on a semiconductor substrate, and forming a bottom source/drain region adjacent a base of the fin. In the method, a dielectric layer, a work function metal layer and a first gate metal layer are sequentially deposited on the bottom source/drain region and around the fin. The dielectric layer, the work function metal layer and the first gate metal layer form a gate structure. The method also includes removing the dielectric layer, the work function metal layer and the first gate metal layer from an end portion of the fin, and depositing a second gate metal layer around the end portion of the fin in place of the removed dielectric layer, the removed work function metal layer and the removed first gate metal layer. The second gate metal layer contacts the end portion of the fin.

According to an exemplary embodiment of the present invention, a semiconductor device includes a channel region disposed on and extending perpendicularly with respect to a semiconductor substrate, a bottom source/drain region disposed adjacent a base of the channel region, and a top source/drain region disposed on the channel region. A gate structure comprising a dielectric layer, a work function metal layer and a first gate metal layer is disposed on the bottom source/drain region and around part of the channel region. The semiconductor device further includes a second gate metal layer disposed around an end portion of channel region. The second gate metal layer contacts the end portion of the channel region.

According to an exemplary embodiment of the present invention, a method for manufacturing a vertical transistor device includes forming a fin on a semiconductor substrate, and sequentially depositing a dielectric layer, a work function metal layer and a first gate metal layer around the fin. The dielectric layer, the work function metal layer and the first gate metal layer form a gate structure. In the method, a mask is formed on the gate structure and the fin, and includes an opening corresponding to an end portion of the fin. The dielectric layer, the work function metal layer and the first gate metal layer are removed from the end portion of the fin through the opening in the mask. The method also includes depositing a second gate metal layer around the end portion of the fin in place of the removed dielectric layer, the removed work function metal layer and the removed first gate metal layer through the opening in the mask. The second gate metal layer contacts the end portion of the fin.

These and other exemplary embodiments of the invention will be described in or become apparent from the following detailed description of exemplary embodiments, which is to be read in connection with the accompanying drawings.

BRIEF DESCRIPTION OF THE DRAWINGS

Exemplary embodiments of the present invention will be described below in more detail, with reference to the accompanying drawings, of which:

FIG. 2 is a cross-sectional view illustrating recessing of portions of a semiconductor substrate in a method of manufacturing a semiconductor device, according to an exemplary embodiment of the present invention.

FIG. 3 is a cross-sectional view illustrating epitaxial growth of a bottom source/drain region and junction formation in a method of manufacturing a semiconductor device, according to an exemplary embodiment of the present invention.

DETAILED DESCRIPTION

Figure 1B:
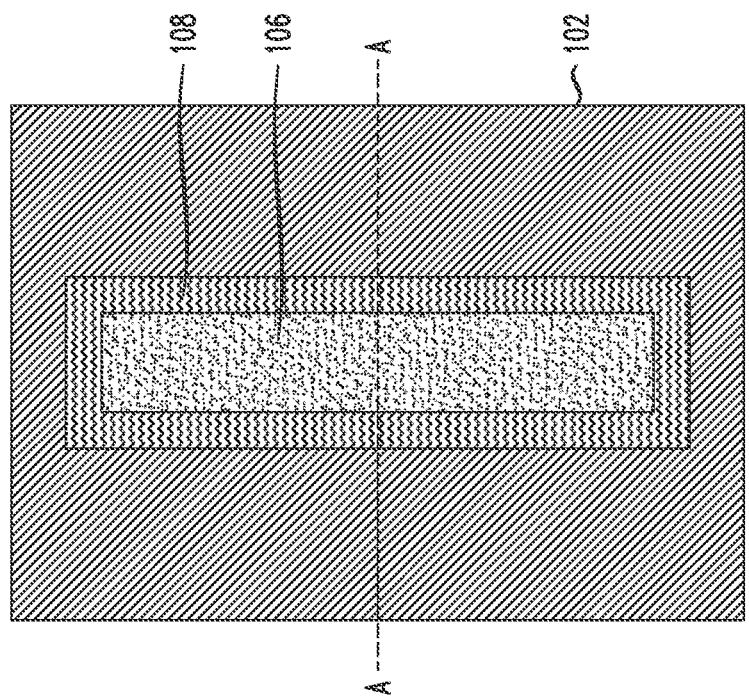
FIG. 1B is a top view illustrating fin and spacer formation in a method of manufacturing a semiconductor device, according to an exemplary embodiment of the present invention.

Exemplary embodiments of the invention will now be discussed in further detail with regard to semiconductor devices and methods of manufacturing same and, in particular, to forming body-contacted VFETs for high-performance and power-efficient applications.

It is to be understood that the various layers and/or regions shown in the accompanying drawings are not drawn to scale, and that one or more layers and/or regions of a type commonly used in, for example, FinFET, VFET, CMOS, field-effect transistor (FET), nanowire FET, nanosheet FETs, metal-oxide-semiconductor field-effect transistor (MOSFET), single electron transistor (SET) and/or other semiconductor devices may not be explicitly shown in a given drawing. This does not imply that the layers and/or regions not explicitly shown are omitted from the actual devices. In addition, certain elements may be left out of particular views for the sake of clarity and/or simplicity when explanations are not necessarily focused on the omitted elements. Moreover, the same or similar reference numbers used throughout the drawings are used to denote the same or similar features, elements, or structures, and thus, a detailed explanation of the same or similar features, elements, or structures will not necessarily be repeated for each of the drawings.

The semiconductor devices and methods for forming same in accordance with embodiments of the present invention can be employed in applications, hardware, and/or electronic systems. Suitable hardware and systems for implementing embodiments of the invention may include, but are not limited to, personal computers, communication networks, electronic commerce systems, portable communications devices (e.g., cell and smart phones), solid-state media storage devices, functional circuitry, etc. Systems and hardware incorporating the semiconductor devices are contemplated embodiments of the invention. Given the teachings of embodiments of the invention provided herein, one of ordinary skill in the art will be able to contemplate other implementations and applications of embodiments of the invention.

The embodiments of the present invention can be used in connection with semiconductor devices that may require, for example, FinFETs, VFETs, CMOSs, FETs, nanowire FETs, nanosheet FETs, SETs, and/or MOSFETs. By way of non-limiting example, the semiconductor devices can include, but are not necessarily limited to FinFET, VFET, CMOS, FET, nanowire FET, nanosheet FET, SET, CMOS and MOSFET devices, and/or semiconductor devices that use FinFET, VFET, CMOS, FET, nanowire FET, nanosheet FET, SET, CMOS and/or MOSFET technology.

As used herein, "height" refers to a vertical size of an element (e.g., a layer, trench, hole, opening, etc.) in the cross-sectional views measured from a bottom surface to a top surface of the element, and/or measured with respect to a surface on which the element is located. Conversely, a "depth" refers to a vertical size of an element (e.g., a layer, trench, hole, opening, etc.) in the cross-sectional views measured from a top surface to a bottom surface of the element. Terms such as "thick", "thickness", "thin" or derivatives thereof may be used in place of "height" where indicated.

As used herein, "lateral," "lateral side," "lateral surface" refers to a side surface of an element (e.g., a layer, opening, etc.), such as a left or right side surface in the drawings.

As used herein, "width" or "length" refers to a size of an element (e.g., a layer, trench, hole, opening, etc.) in the drawings measured from a side surface to an opposite surface of the element. Terms such as "thick", "thickness", "thin" or derivatives thereof may be used in place of "width" or "length" where indicated.

As used herein, terms such as "upper", "lower", "right", "left", "vertical", "horizontal", "top", "bottom", and derivatives thereof shall relate to the disclosed structures and methods, as oriented in the drawing figures. For example, as used herein, "vertical" refers to a direction perpendicular to the top surface of the substrate in the cross-sectional views, and "horizontal" refers to a direction parallel to the top surface of the substrate in the cross-sectional views.

As used herein, unless otherwise specified, terms such as "on", "overlying", "atop", "on top", "positioned on" or "positioned atop" mean that a first element is present on a second element, wherein intervening elements may be present between the first element and the second element. As used herein, unless otherwise specified, the term "directly" used in connection with the terms "on", "overlying", "atop", "on top", "positioned on" or "positioned atop" or the term "direct contact" mean that a first element and a second element are connected without any intervening elements, such as, for example, intermediary conducting, insulating or semiconductor layers, present between the first element and the second element.

Threshold voltage in a MOSFET, such as a variable threshold voltage MOSFET (VTMOS), can be modulated by contact of a gate metal to a portion of the channel region (referred to herein as "body contact"). The contact is made between a gate metal and a portion of the channel (body) which is un-depleted. "Un-depleted" refers to the state in which the semiconductor material maintains a sufficient amount of carriers to remain conductive in the presence of applied voltages.

As a result of the body contact, the body potential is increased as the gate potential is increased, the effective threshold voltage is reduced as the body potential is increased, and the effective drive current is increased as the effective threshold voltage is reduced.

In accordance with one or more embodiments, dynamic threshold voltage control of a VFET is enabled by body contact. Body contact of a gate metal to a portion of a fin of a VFET provides dynamic/tunable control of threshold voltage defined by a work function of a gate metal to meet target device operation requirements (e.g., lower $V_T$ for high-performance operation) without integrating metals with different work functions. The embodiments utilizing body contact maintain design compactness of a VFET without increasing device area. In addition, one or more embodiments mitigate potential floating-body effects if a VFET channel is partially-depleted, and provide advantages of decreased resistance-capacitance (RC) delay and low off-state current (e.g., leakage).

The cross-sections in FIGS. 1A, 4A, 5A, 8A, 9A and 11A are taken along the lines A-A on FIGS. 1B, 4B, 5B, 8B, 9B and 11B, respectively.

Figure 1A:
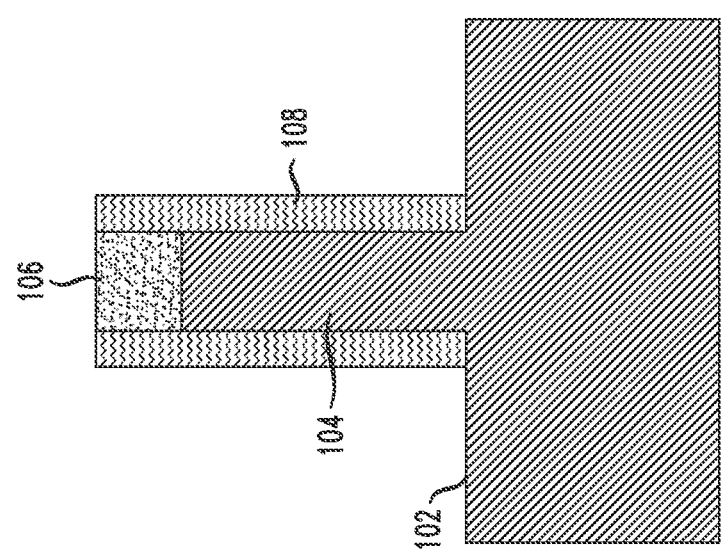
FIG. 1A is a cross-sectional view illustrating fin and spacer formation in a method of manufacturing a semiconductor device, according to an exemplary embodiment of the present invention.

FIGS. 1A and 1B are cross-sectional and top views illustrating fin and spacer formation in a method of manufacturing a semiconductor device, according to an exemplary embodiment of the present invention. Referring to FIGS. 1A and 1B, a semiconductor substrate 102 includes semiconductor material including, but not limited to, silicon (Si), silicon germanium (SiGe), silicon carbide (SiC), Si:C (carbon doped silicon), silicon germanium carbide (SiGeC), carbon doped silicon germanium (SiGe:C), III-V, II-VI compound semiconductor or other like semiconductor. In addition, multiple layers of the semiconductor materials can be used as the semiconductor material of the substrate. The semiconductor substrate 102 can be a bulk substrate or a semiconductor-on-insulator substrate such as, but not limited to, a silicon-on-insulator (SOI), silicon-germanium-on-insulator (SGOI) or III-V-on-insulator substrate including a buried insulating layer, such as, for example, a buried oxide, nitride layer or aluminum oxide.

Fins, such as fin 104, can be formed by patterning a portion of the semiconductor substrate 102 or a semiconductor layer on the substrate 102 into the fins. According to an embodiment, a hardmask 106 including, for example, a dielectric material, such as silicon nitride (SiN) is formed on portions of the semiconductor layer that are to be formed into the fins. The fin patterning can be done by various patterning techniques, including, but not necessarily limited to, directional etching and/or a sidewall image transfer (SIT) process, for example. The SIT process includes using lithography to form a pattern referred to as a mandrel. The mandrel material can include, but is not limited to, amorphous silicon or amorphous carbon. After the mandrel formation, a conformal film can be deposited and then followed by an etchback. The conformal film will form spacers at both sides of the mandrel. The spacer material can include, but is not limited, oxide or SiN. After that, the mandrel can be removed by reactive ion etching (RIE) processes. As a result, the spacers will have half the pitch of the mandrel. In other words, the pattern is transferred from a lithography-defined mandrel to spacers, where the pattern density is doubled. The spacer pattern can be used as the hard mask to form the fins by RIE processes. Alternatively, fin patterning can be done by any other suitable patterning technique, including but not limited to, lithography (e.g., extreme ultraviolet (EUV)) in conjunction with RIE, self-aligned double patterning (SADP), self-aligned multiple patterning (SAMP), and/or self-aligned quadruple patterning (SAQP)). While embodiments of the present invention describe channel regions as fins, the embodiments are not necessarily limited to fin channel regions, and may include nanowire channel regions. The drawings illustrate one fin 104 on the substrate 102. Although one fin 104 is shown in the figures for ease of explanation, more than one fin can be formed.

A dielectric layer is deposited on the fin 104, hardmask 106 and on exposed surfaces of the substrate 102, and portions of the dielectric layer are removed to form spacer layers 108 remaining on the vertical surfaces of the fin 104 and hardmask 106. For example, horizontal portions of the dielectric layer are removed in a RIE process. The RIE process can be performed using, for example, $CH_4$, $CHF_3$, or $CH_2F_2$ chemistry. In accordance with an embodiment of the present invention, the spacers 108 comprise for example, SiN, silicon boron nitride (SiBN), siliconborocarbonitride (SiBCN) or some other dielectric, and have a thickness of about 2 nm to about 10 nm.

The dielectric layer is deposited on the fin 104, hardmask 106 and on exposed surfaces of the substrate 102 using, for example, deposition techniques including, but not limited to, chemical vapor deposition (CVD), plasma enhanced CVD (PECVD), radio-frequency CVD (RFCVD), physical vapor deposition (PVD), atomic layer deposition (ALD), molecular layer deposition (MLD), molecular beam deposition (MBD), pulsed laser deposition (PLD), liquid source misted chemical deposition (LSMCD), and/or sputtering.

FIG. 2 is a cross-sectional view illustrating recessing of portions of a semiconductor substrate in a method of manufacturing a semiconductor device, according to an exemplary embodiment of the present invention. Referring to FIG. 2, portions of the substrate 102 not covered by the hardmask 106, and the spacers 108 are recessed to form recessed regions 103. The recessing of the substrate 102 leaves a pedestal portion 105 aligned under the spacer and fin structures, the pedestal portion 105 having width of the fin 104 plus the width of the spacers 108 alongside the fin 104. The recessing of the substrate 102 is performed using directional RIE with, for example, fluorine or chlorine-based gases.

FIG. 3 is a cross-sectional view illustrating epitaxial growth of a bottom source/drain region and junction formation in a method of manufacturing a semiconductor device, according to an exemplary embodiment of the present invention. Referring to FIG. 3, a bottom source/drain region 110 is formed on the recessed portions 103 of the substrate 102 and around the pedestal portion 105 adjacent a base of the fin 104. In one or more embodiments, the bottom source/drain region 110 is formed by a bottom-up epitaxial growth process. The epitaxially grown bottom source/drain region 110 can be in-situ doped, meaning dopants are incorporated into the epitaxy film during the epitaxy process. Other alternative doping techniques can be used, including but not limited to, for example, ion implantation, gas phase doping, plasma doping, plasma immersion ion implantation, cluster doping, infusion doping, liquid phase doping, solid phase doping, etc. Dopants may include, for example, an n-type dopant selected from a group of phosphorus (P), arsenic (As) and antimony (Sb), and a p-type dopant selected from a group of boron (B), gallium (Ga), indium (In), and thallium (Tl) at various concentrations. For example, in a non-limiting example, a dopant concentration range may be $1\times10^{18}/cm^3$ to $1\times10^{21}/cm^3$. The bottom source/drain region 110 can be p-type or n-type.

Terms such as "epitaxial growth and/or deposition" and "epitaxially formed and/or grown" refer to the growth of a semiconductor material on a deposition surface of a semiconductor material, in which the semiconductor material being grown has the same crystalline characteristics as the semiconductor material of the deposition surface. In an epitaxial deposition process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material has the same crystalline characteristics as the deposition surface on which it is formed. For example, an epitaxial semiconductor material deposited on a {100} crystal surface will take on a {100} orientation. In some embodiments, epitaxial growth and/or deposition processes are selective to forming on a semiconductor surface, and do not deposit material on dielectric surfaces, such as silicon dioxide or silicon nitride surfaces.

Examples of various epitaxial growth processes include, for example, rapid thermal chemical vapor deposition (RTCVD), low-energy plasma deposition (LEPD), ultra-high vacuum chemical vapor deposition (UHVCVD), atmospheric pressure chemical vapor deposition (APCVD) and molecular beam epitaxy (MBE). The temperature for an epitaxial deposition process can range from 500° C. to 900° C. Although higher temperature typically results in faster deposition, the faster deposition may result in crystal defects and film cracking.

A number of different sources may be used for the epitaxial growth of the compressively strained layer. In some embodiments, a gas source for the deposition of epitaxial semiconductor material includes a silicon containing gas source, a germanium containing gas source, or a combination thereof. For example, an epitaxial silicon layer may be deposited from a silicon gas source including, but not necessarily limited to, silane, disilane, ldisilane, trisilane, tetrasilane, hexachlorodisilane, tetrachlorosilane, dichlorosilane, trichlorosilane, and combinations thereof. An epitaxial germanium layer can be deposited from a germanium gas source including, but not necessarily limited to, germane, digermane, halogermane, dichlorogermane, trichlorogermane, tetrachlorogermane and combinations thereof. While an epitaxial silicon germanium alloy layer can be formed utilizing a combination of such gas sources. Carrier gases like hydrogen, nitrogen, helium and argon can be used.

A bottom source/drain junction region 111 is formed between the bottom source/drain region 110 and the fin 104, and may include a lower portion of the fin 104. The junction region 111 is formed by an annealing process which causes dopant diffusion. More specifically, the doped bottom source/drain junction region 111 is formed by dopant diffusion from the bottom source/drain region 110 into the pedestal portion 105 and a lower portion of the fin 104. Although not shown, the junction region may extend into parts of the substrate 102 under the bottom source/drain regions 110. The annealing process can be, for example, a drive-in annealing process performed at temperatures in the range of, for example, about 800° C. to 1300° C. and for durations in the range of, for example, about 0.01 seconds to 10 minutes.

Figure 4B:
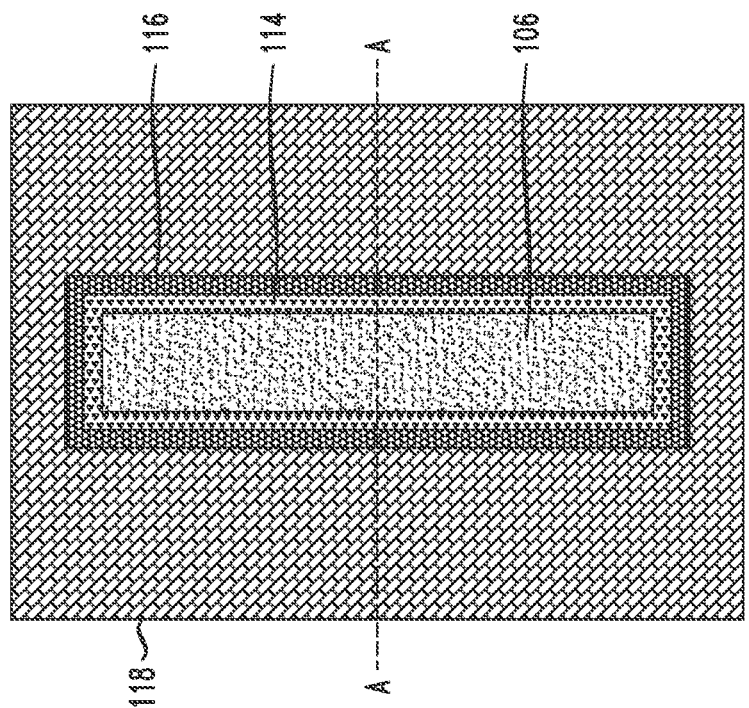
FIG. 4B is a top view illustrating bottom spacer and gate structure formation in a method of manufacturing a semiconductor device, according to an exemplary embodiment of the present invention.
Figure 4A:
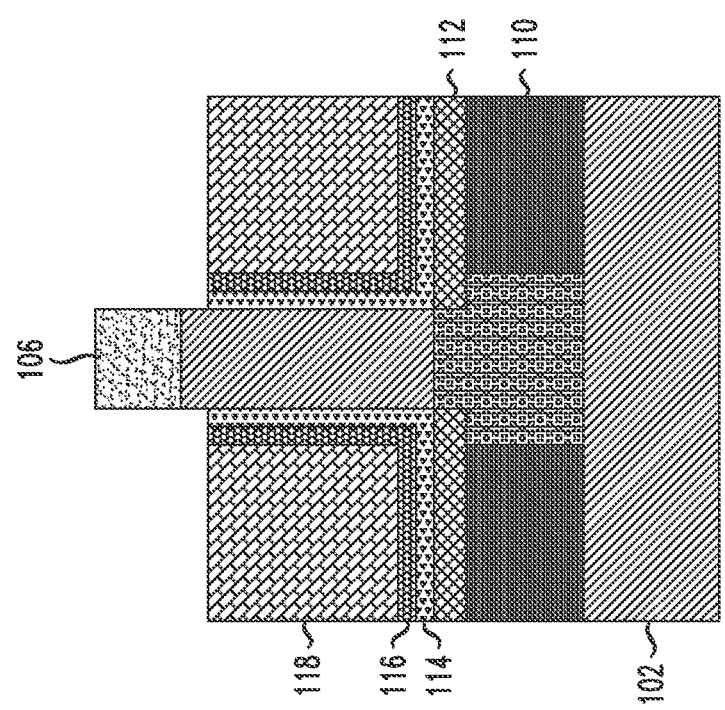
FIG. 4A is a cross-sectional view illustrating bottom spacer and gate structure formation in a method of manufacturing a semiconductor device, according to an exemplary embodiment of the present invention.

FIGS. 4A and 4B are cross-sectional and top views illustrating bottom spacer and gate structure formation in a method of manufacturing a semiconductor device, according to an exemplary embodiment of the present invention. Referring to FIGS. 4A and 4B, after junction annealing to form the bottom source/drain junction region 111, the spacers 108 are selectively removed with respect to the hardmask 106 and the bottom source/drain region 110, using for example, a wet removal process, such as, for example, etching with hot phosphoric acid.

A bottom spacer layer 112 is formed on exposed horizontal surfaces including the bottom source/drain and junction regions 110 and 111. Spacer material includes, but is not necessarily limited to, plasma enhanced chemical vapor deposition (PECVD)-type, high aspect ratio process (HARP)-type or high density plasma (HDP)-type low-K dielectric layers, including, but not necessarily limited to, SiBN, SiBCN, silicon oxycarbonitride (SiOCN), SiN or silicon oxide ($SiO_x$). According to an embodiment, the bottom spacer layer 112 is deposited using, for example, directional deposition techniques, including, but not necessarily limited to, high density plasma (HDP) deposition, PVD, and gas cluster ion beam (GCIB) deposition. The directional deposition deposits the spacer material preferably on the exposed horizontal surfaces, but not on lateral sidewalls. Spacer material formed on the hardmask 106 (not shown) can be removed using a planarization step, such as, for example, chemical mechanical polishing (CMP). Other methods known to those of ordinary skill in the art, such as, for example, conformal deposition techniques and RIE, may also be used to form the bottom spacer layer 112.

A gate metal layer 118 and a work function metal (WFM) layer 116 are formed on a high-k dielectric layer 114 around the fin 104. The high-k dielectric layer 114 is formed around and contacts the fin 104, and includes, for example, a high-k material including, but not necessarily limited to, $HfO_2$ (hafnium oxide), $ZrO_2$ (zirconium dioxide), hafnium zirconium oxide $Al_2O_3$ (aluminum oxide), and $Ta_2O_5$ (tantalum pentoxide). The WFM and high-k dielectric layers 116 and 114 are conformally deposited on the bottom spacer layer 112 and on and around the fin 104 including the hardmask 106 thereon.

The WFM layer 116 is deposited on the high-k dielectric layer 114 and includes, for example, titanium nitride (TiN), tantalum nitride (TaN), ruthenium (Ru), titanium aluminum nitride (TiAlN), titanium aluminum carbon nitride (TiAlCN), titanium aluminum carbide (TiAlC), tantalum aluminum carbide (TaAlC), tantalum aluminum carbon nitride (TaAlCN) or lanthanum (La) doped TiN or TaN.

The gate metal layer 118 is deposited on the WFM layer 116 and includes, for example, a low resistance metal, such as, for example, tungsten, cobalt, zirconium, tantalum, titanium, aluminum, ruthenium, copper, metal carbides, metal nitrides, transition metal aluminides, tantalum carbide, titanium carbide, tantalum magnesium carbide, or combinations thereof.

The gate metal, WFM and high-k gate dielectric layers 118, 116 and 114 are deposited using, for example, one or more deposition techniques including, but not limited to, CVD, PECVD, RFCVD, PVD, ALD, MLD, MBD, PLD, LSMCD, sputtering, and/or plating. An isotropic etch is performed to recess the gate structure, including the gate metal, WFM and high-k gate dielectric layers 118, 116 and 114 to, for example, a vertical height below the vertical height of the fin 104 and below the hardmask 106. Alternatively, the gate structure is recessed to a vertical height the same as or substantially the same as the vertical height of the fin 104. According to an embodiment, recessing is performed by diluted SC1 (Standard Cleaning 1) or hydrogen peroxide for recessing the gate metal and WFM layers 118 and 116, and a diluted HF/HCl solution for recessing the high-k dielectric layer 114.

Figure 5B:
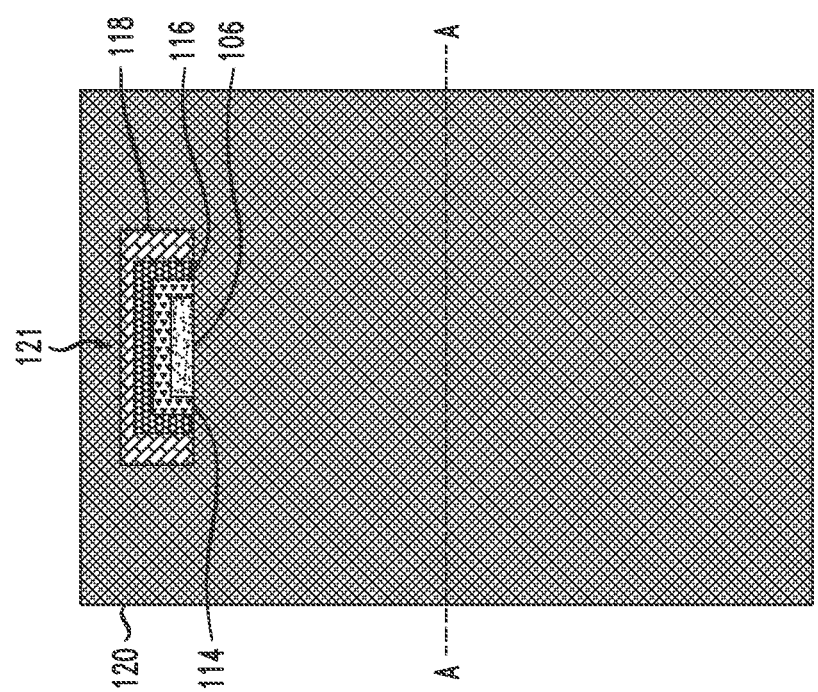
FIG. 5B is a top view illustrating formation of a body contact mask including an opening exposing portions of a gate structure and a hard mask in a method of manufacturing a semiconductor device, according to an exemplary embodiment of the present invention.
Figure 5A:
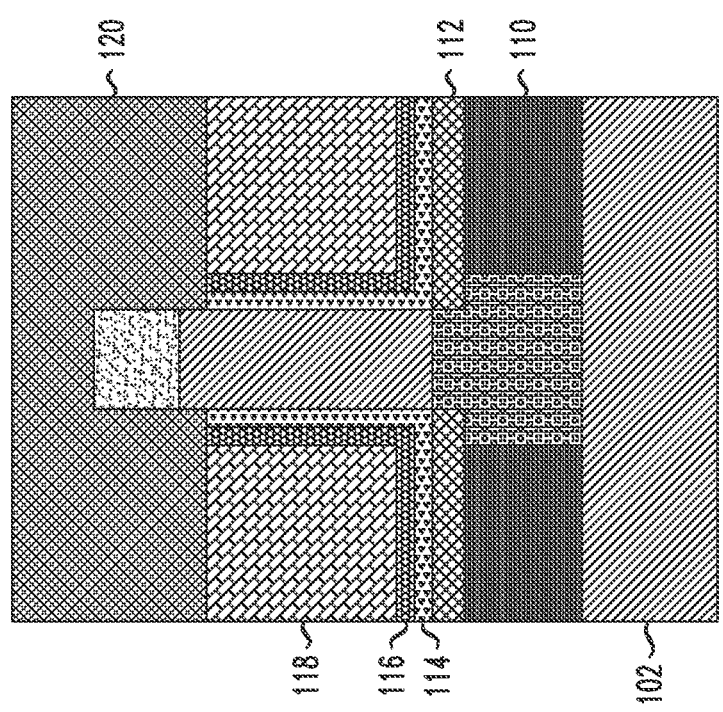
FIG. 5A is a cross-sectional view illustrating formation of a body contact mask including an opening exposing portions of a gate structure and a hard mask in a method of manufacturing a semiconductor device, according to an exemplary embodiment of the present invention.

FIGS. 5A and 5B are cross-sectional and top views illustrating formation of a body contact mask including an opening exposing portions of a gate structure and a hard mask in a method of manufacturing a semiconductor device, according to an exemplary embodiment of the present invention. Referring to FIGS. 5A and 5B, a body contact mask 120 is deposited on the structure from FIGS. 4A and 4B using one or more deposition techniques, including, but not necessarily limited to, CVD, PECVD, RFCVD, PVD, ALD, MLD, MBD, PLD, LSMCD, sputtering, and/or plating. The body contact mask 120 includes for example, a dielectric material, such as, but not necessarily limited to, SiN. As shown in the top view of FIG. 5B, the body contact mask includes an opening 121 exposing part of the gate metal layer 118, part of the WFM layer 116, part of the high-K dielectric layer 114 and part of the hard mask 106. As can be understood from the top view of FIG. 5B, the exposed portions of the gate metal layer 118, the WFM layer 116, the high-K dielectric layer 114 and the hard mask 106 are located at a lengthwise end of the fin 104, the length of the fin 104 extending parallel to the substrate 102 (e.g., into and out of the page in the cross-sectional view of FIG. 5A).

Figure 6:
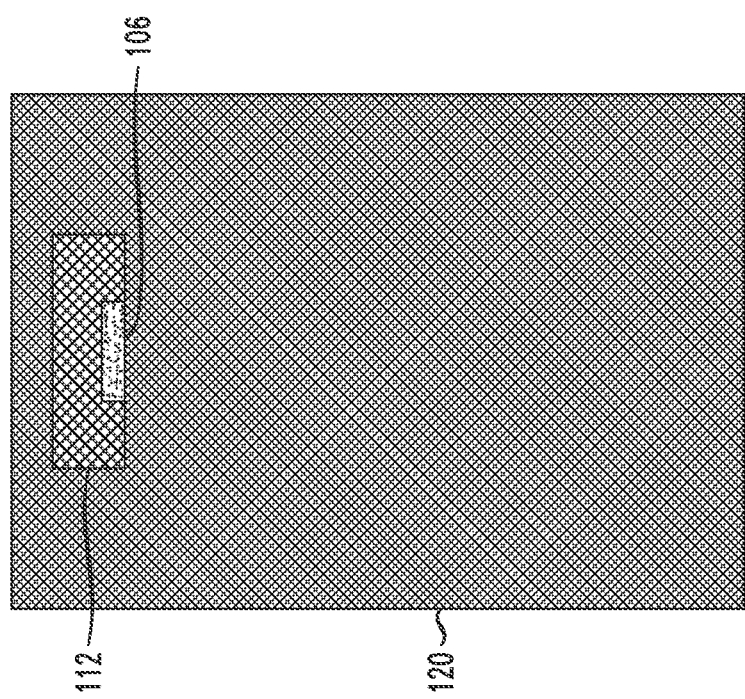
FIG. 6 is a top view illustrating removal of exposed portions of a gate structure down to a bottom spacer in a method of manufacturing a semiconductor device, according to an exemplary embodiment of the present invention.

FIG. 6 is a top view illustrating removal of exposed portions of a gate structure down to a bottom spacer in a method of manufacturing a semiconductor device, according to an exemplary embodiment of the present invention. Referring to FIG. 6, an etching process, such as, for example a RIE process, is performed to remove the exposed portions of the gate structure through the opening 121, including the exposed portions of gate metal, WFM and high-k gate dielectric layers 118, 116 and 114 down to the bottom spacer layer 112, creating a hole having a depth from a top surface of the body contact mask 120 down to a top surface of the bottom spacer layer 112.

The removal of the exposed portions of the gate structure exposes the bottom spacer 112. In addition, the exposed portions of the gate structure are removed from an end portion of the fin 104 under the exposed portion of the hard mask 106 (i.e., the lengthwise end portion of the fin 104 discussed in connection with FIG. 5B), so that sides of the end portion of the fin 104 extending vertically with respect to the substrate 102 from the top surface of the bottom spacer layer 112 to the top of the fin 104 are exposed through the opening 121 in the body contact mask 120. According to an embodiment, the RIE is performed by diluted SC1 (Standard Cleaning 1) or hydrogen peroxide for removing the exposed portions of the gate metal and WFM layers 118 and 116, and a diluted HF/HCl solution for removing the high-k dielectric layer 114.

Figure 7:
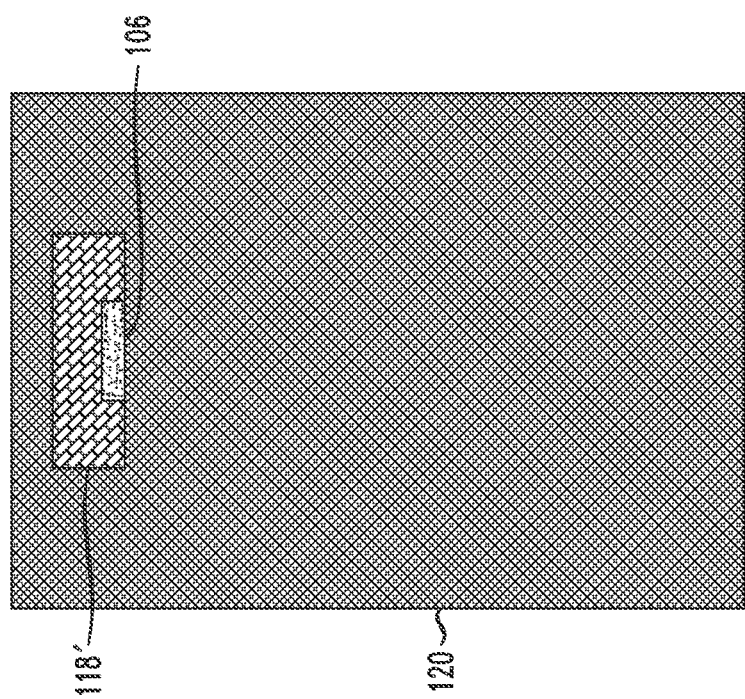
FIG. 7 is a top view illustrating deposition and recessing of a gate metal on an exposed portion of a bottom spacer in a method of manufacturing a semiconductor device, according to an exemplary embodiment of the present invention.

FIG. 7 is a top view illustrating deposition and recessing of a gate metal 118' on an exposed portion of a bottom spacer 112 in a method of manufacturing a semiconductor device, according to an exemplary embodiment of the present invention. Referring to FIG. 7, a gate metal layer 118' is deposited through the opening 121 in the body contact mask 120 on the exposed portions of the bottom spacer layer 112, and on and around the exposed sides of the end portion of the fin 104, so that gate metal 118' is in direct contact with the end portion of the fin 104, with no intervening WFM or high-K dielectric layers 116 or 114 between the gate metal 118' and the end portion of the fin 104. As a result the gate metal 118' directly contacts an end portion of the fin 104 laterally, causing a body contact of the gate metal 118' to the fin 104.

According to an embodiment, the gate metal 118' is the same material as the gate metal 118. Alternatively, the gate metal 118' can be a different material than the gate metal 118 to enhance control of the body potential when needed. The gate metal 118' includes, for example, a low resistance metal, such as, for example, tungsten, cobalt, zirconium, tantalum, titanium, aluminum, ruthenium, copper, metal carbides, metal nitrides, transition metal aluminides, tantalum carbide, titanium carbide, tantalum magnesium carbide, or combinations thereof.

The gate metal layer 118' is deposited using, for example, one or more deposition techniques including, but not limited to, CVD, PECVD, RFCVD, PVD, ALD, MLD, MBD, PLD, LSMCD, sputtering, and/or plating. An isotropic etch is performed to recess the gate metal layer 118' to, for example, a vertical height below the vertical height of the fin 104 and below the hardmask 106. Alternatively, the gate metal layer 118' is recessed to a vertical height the same as or substantially the same as the vertical height of the fin 104. The gate metal layer 118' is recessed a vertical height that is the same as or substantially the same as the recessed height of the gate structure described in connection with FIGS. 4A and 4B. According to an embodiment, recessing is performed by diluted SC1 (Standard Cleaning 1) or hydrogen peroxide.

Figure 8B:
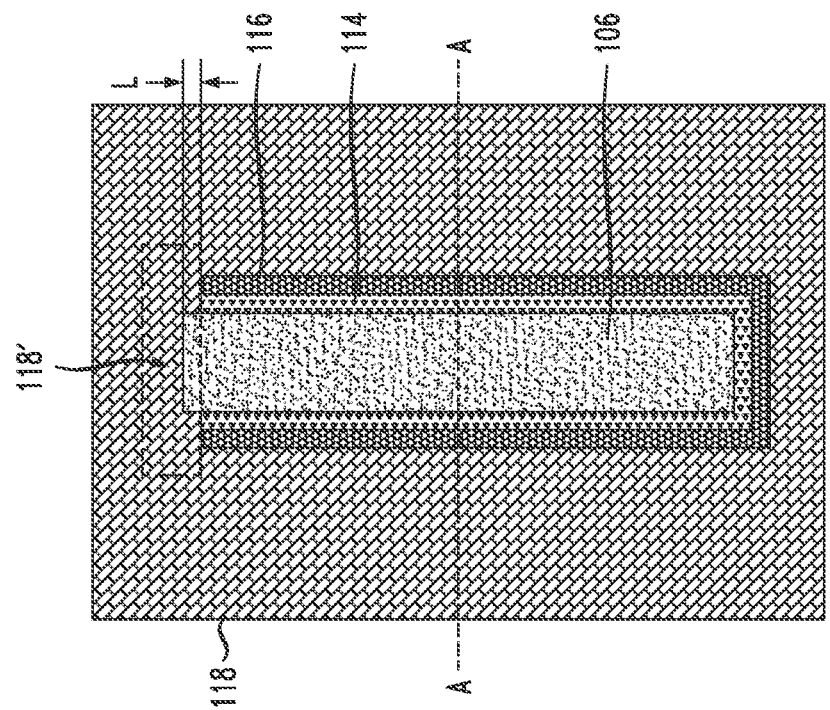
FIG. 8B is a top view illustrating removal of a body contact mask in a method of manufacturing a semiconductor device, according to an exemplary embodiment of the present invention.
Figure 8A:
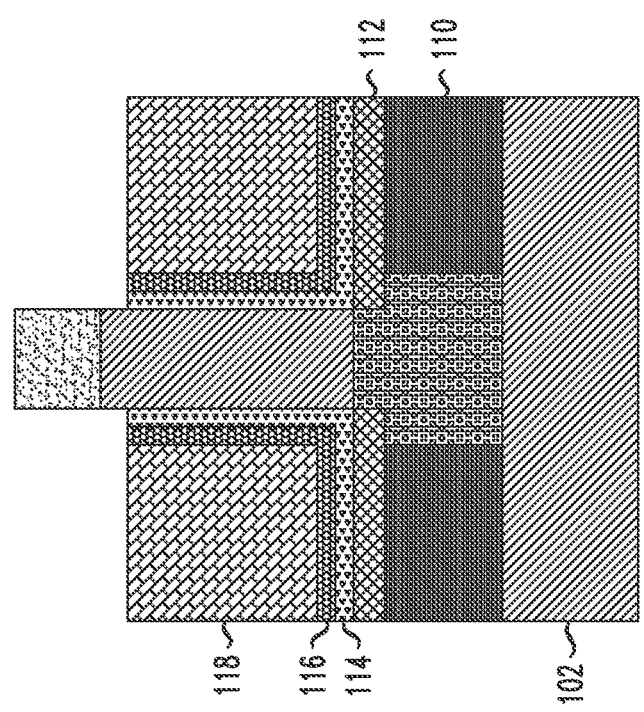
FIG. 8A is a cross-sectional view illustrating removal of a body contact mask in a method of manufacturing a semiconductor device, according to an exemplary embodiment of the present invention.

FIGS. 8A and 8B are cross-sectional and top views illustrating removal of a body contact mask 120 in a method of manufacturing a semiconductor device, according to an exemplary embodiment of the present invention. Referring to FIGS. 8A and 8B, the body contact mask 120 is removed using, for example, lithography processes. The removal of the body contact mask 120 exposes top surfaces of the gate structure including the gate metal, WFM and high-k gate dielectric layers 118, 116 and 114, as well as the gate metal layer 118' (in hashed rectangular portion), and the hardmask 106 on the fin 104. As can be understood from the top view in FIG. 8B, the body contact (i.e., the direct contact between the gate metal 118' and a portion of the fin 104) includes lateral contact of the gate metal 118' to three vertically extending sides of the end portion of the fin 104 around which the gate metal 118' is formed. The vertical extension of the contacted sides of fin 104 is in a direction perpendicular with respect to a top surface of the substrate 102. According to one or more non-limiting embodiments, for a semiconductor fin 104 that is about 6 nm to about 8 nm wide (left-right direction in drawings), the length (L) of the side walls of the fin that directly contact the gate metal 118' is in the range of about 2 nm to about 6 nm, for example, about 2 nm to about 3 nm.

Figure 9A:
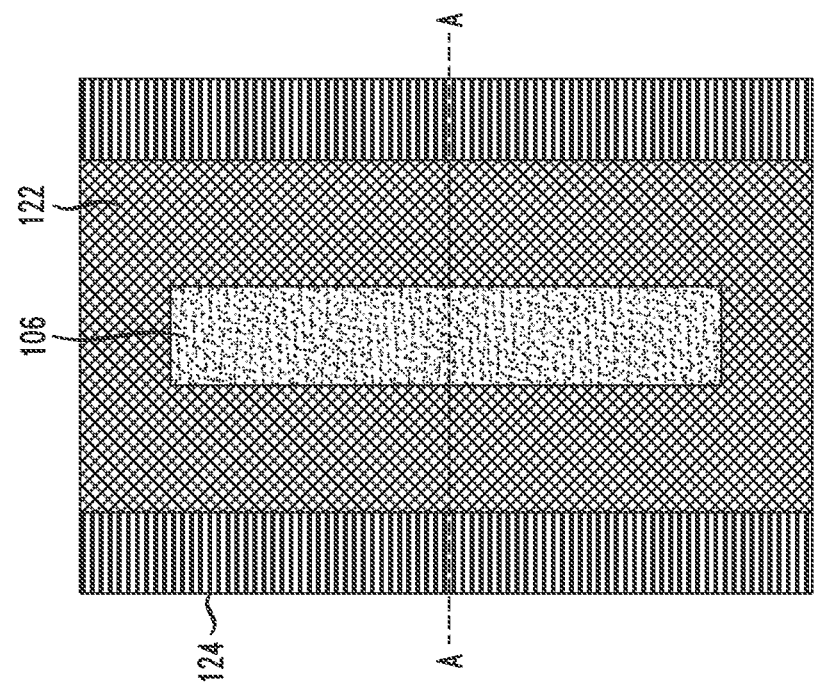
FIG. 9A is a cross-sectional view illustrating top spacer and inter-layer dielectric (ILD) layer formation in a method of manufacturing a semiconductor device, according to an exemplary embodiment of the present invention.
Figure 9B:
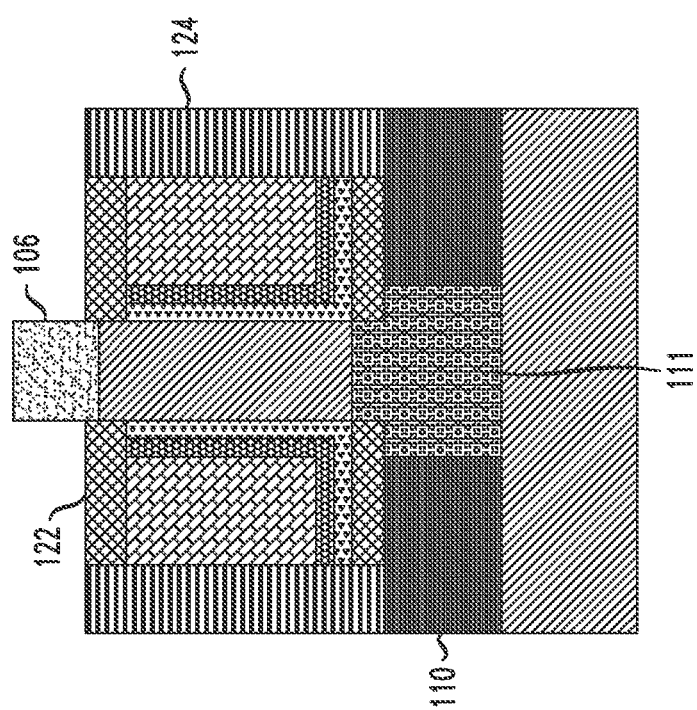
FIG. 9B is a top view illustrating top spacer and inter-layer dielectric (ILD) layer formation in a method of manufacturing a semiconductor device, according to an exemplary embodiment of the present invention.

FIGS. 9A and 9B are cross-sectional and top views illustrating top spacer and inter-layer dielectric (ILD) layer formation in a method of manufacturing a semiconductor device, according to an exemplary embodiment of the present invention. Referring to FIGS. 9A and 9B, a top spacer layer 122 is formed on the structure of FIGS. 8A and 8B, including on the recessed gate metal layers 118 and 118', and on the recessed WFM and high-k gate dielectric layers 116 and 114, and on and around the fin 104. The top spacer layer 122 includes, for example, PECVD-type, HARP-type or HDP-type low-K dielectric layers, including, but not necessarily limited to, SiBN, SiBCN, SiOCN, SiN or $SiO_x$. According to an embodiment, the bottom spacer layer 112 is deposited using, for example, directional deposition techniques, including, but not necessarily limited to, HDP deposition, PVD, and GCIB deposition. The directional deposition deposits the spacer material preferably on the exposed horizontal surfaces, but not on lateral sidewalls. Spacer material formed on the hardmask 106 (not shown) can be removed using a planarization step, such as, for example, CMP. Other methods known to those of ordinary skill in the art, such as, for example, conformal deposition techniques and RIE, may also be used to form the top spacer layer 122.

Following formation of the top spacer layer 122, the width of the gate structure and of the top and bottom spacers 122 and 112 on the bottom source/drain region 110 is reduced using, for example, RIE processing, which removes portions of the gate structure and of the top and bottom spacers 122 and 112 down to the bottom source/drain region 110. Following the removal, an ILD layer 124 is deposited on the bottom source/drain region 110 on the side of the gate structure and the spacers 112 and 122 to fill in the portions on the exposed parts of the bottom source/drain region 110. The ILD layer 124 includes a dielectric material, such as, but not limited to $SiO_x$, SiOC, SiOCN or some other dielectric. The ILD layer 185 can be deposited using deposition techniques including, but not limited to, CVD, PECVD, RFCVD, PVD, ALD, MLD, MBD, PLD, and/or LSMCD, sputtering, and/or plating. In accordance with an embodiment of the present invention, the ILD layer 124 electrically isolates different transistors from each other.

Figure 10:
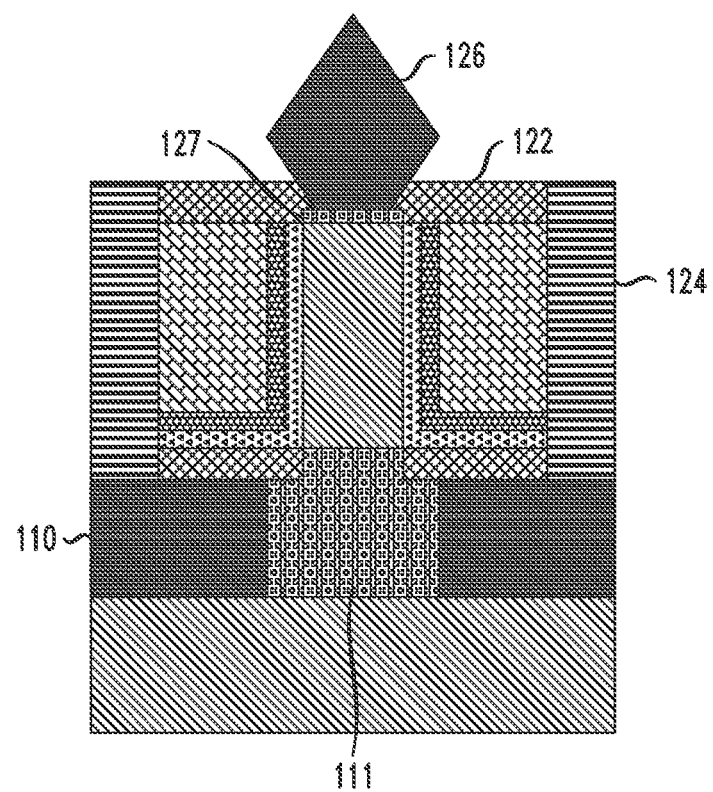
FIG. 10 is a cross-sectional view illustrating epitaxial growth of a top source/drain region and junction formation in a method of manufacturing a semiconductor device, according to an exemplary embodiment of the present invention.

FIG. 10 is a cross-sectional view illustrating epitaxial growth of a top source/drain region and junction formation in a method of manufacturing a semiconductor device, according to an exemplary embodiment of the present invention.

The hardmask 106 on the fin 104, and any excess dielectric material on the hardmask are selectively removed, using for example, CMP and/or RIE. The removal of the hardmask 106 exposes an upper portion of the fin 104 so that a top source/drain regions 126 can be epitaxially grown.

The top source/drain region 126 is epitaxially grown in an epitaxial growth process from the upper portion of the fin 104. The epitaxially grown top source/drain region 126 can be in-situ doped. Other alternative doping techniques can be used, including but not limited to, for example, ion implantation, gas phase doping, plasma doping, plasma immersion ion implantation, cluster doping, infusion doping, liquid phase doping, solid phase doping, etc., and dopants may include, for example, an n-type dopant selected from a group of P, As and Sb, and a p-type dopant selected from a group of B, Ga, In, and Tl at various concentrations. For example, in a non-limiting example, a dopant concentration range may be $1\times10^{18}/cm^3$ to $1\times10^{21}/cm^3$.

A top source/drain junction region 127 is formed between the top source/drain region 126 and the fin 104, and may include an upper portion of the fin 104. The junction region 127 is formed by an annealing process which causes dopant diffusion. More specifically, the doped top source/drain junction region 127 is formed by dopant diffusion from the top source/drain region 126 into an upper portion of the fin 104. The annealing process can be, for example, a drive-in annealing process as described herein above.

Figure 11B:
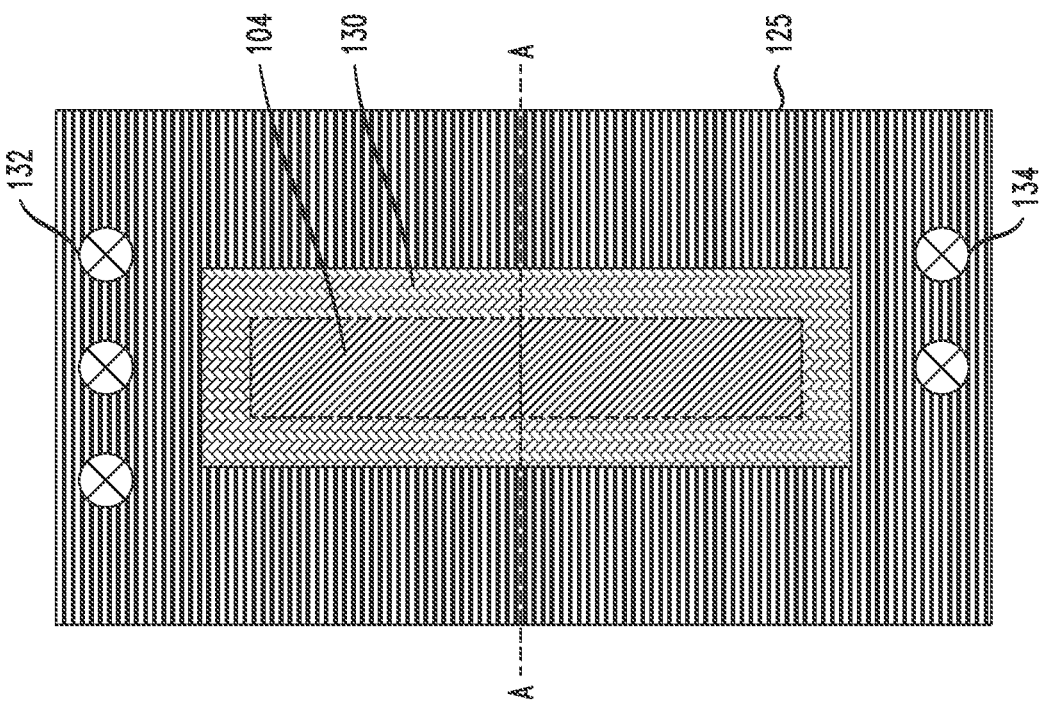
FIG. 11B is a top view illustrating ILD layer and contact formation in a method of manufacturing a semiconductor device, according to an exemplary embodiment of the present invention.
Figure 11A:
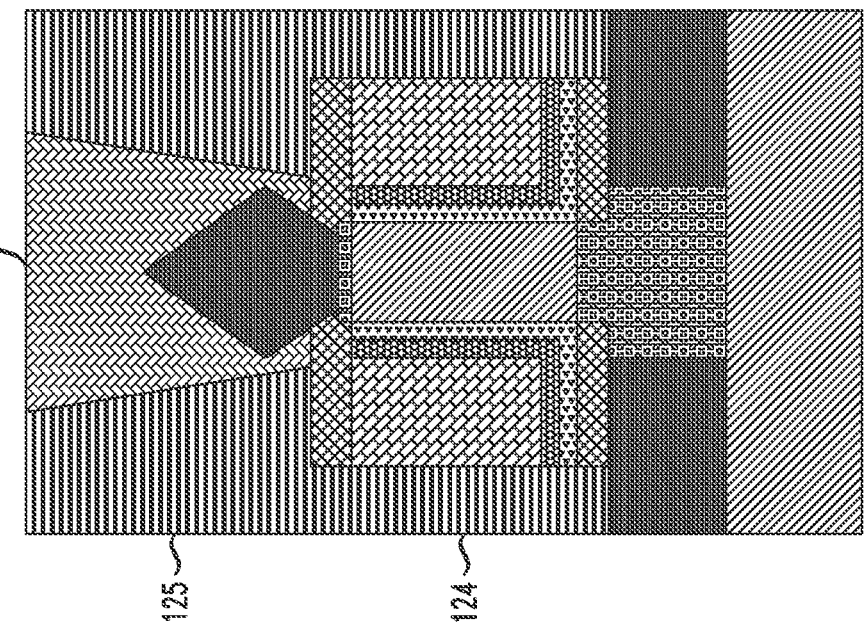
FIG. 11A is a cross-sectional view illustrating ILD layer and contact formation in a method of manufacturing a semiconductor device, according to an exemplary embodiment of the present invention.

FIGS. 11A and 11B are cross-sectional and top views illustrating ILD layer and contact formation in a method of manufacturing a semiconductor device, according to an exemplary embodiment of the present invention. Referring to FIGS. 11A and 11B, following top source/drain region 126 and junction region 127 formation, an ILD layer 125 is deposited on and over the top source/drain region 126 on the structure of FIG. 10 including the existing ILD layer 124 and the top spacer layer 122. The ILD layer 125 is deposited using, for example, deposition techniques including, but not limited to, CVD, PECVD, RFCVD, PVD, ALD, MLD, MBD, PLD, LSMCD, sputtering, and/or plating, followed by a planarization process, such as, for example, CMP. The ILD layer 125 includes the same or similar materials as the ILD layer 124.

Using, for example, lithography followed by RIE, trenches are respectively opened in the ILD layer 125 to expose the top source/drain region 126, gate metal 118 and the bottom source/drain region 110. Contacts 130, 132 and 134 to the top source/drain region 126, gate metal 118 and the bottom source/drain region 110, respectively, are formed in the trenches by filling the trenches with contact material, such as, for example, electrically conductive material including, but not necessarily limited to, tungsten, cobalt, zirconium, tantalum, titanium, aluminum, ruthenium, and/or copper. A liner layer (not shown) including, for example, titanium and/or titanium nitride, may be formed on the top source/drain region 126, gate metal 118 and the bottom source/drain region 110, and on side and bottom surfaces of the trenches before filling the trenches with the contact material layers. Deposition of the contact material layers can be performed using one or more deposition techniques, including, but not necessarily limited to, CVD, PECVD, PVD, ALD, MBD, PLD, LSMCD, and/or spin-on coating, followed by planarization using a planarization process, such as, for example, CMP. Although not visible in a top down view, the underlying fin 104 is shown in hashed lines in FIG. 11B.

Although illustrative embodiments of the present invention have been described herein with reference to the accompanying drawings, it is to be understood that the invention is not limited to those precise embodiments, and that various other changes and modifications may be made by one skilled in the art without departing from the scope or spirit of the invention.

We claim:

1. A semiconductor device, comprising:
   a channel region disposed on and extending perpendicularly with respect to a semiconductor substrate;
   a bottom source/drain region disposed adjacent a base of the channel region;
   a top source/drain region disposed on the channel region;
   a gate structure comprising a dielectric layer, a work function metal layer and a first gate metal layer disposed on the bottom source/drain region and around part of the channel region; and
   a second gate metal layer disposed around an end portion of channel region, wherein the second gate metal layer contacts the end portion of the channel region.

2. The semiconductor device according to claim 1, further comprising a spacer layer disposed on the bottom source/drain region, wherein the second gate metal layer is disposed directly on the spacer layer.

3. The semiconductor device according to claim 2, wherein the gate structure is disposed on the spacer layer.

4. The semiconductor device according to claim 1, wherein the dielectric layer contacts the channel region, the work function metal layer is disposed on the dielectric layer and the first gate metal layer is disposed on the work function metal layer.

5. The semiconductor device according to claim 1, wherein the second gate metal layer comprises the same material as the first gate metal layer.

6. The semiconductor device according to claim 1, wherein the second gate metal layer comprises a different material from the first gate metal layer.

7. The semiconductor device according to claim 1, wherein the second gate metal layer contacts sides of the end portion of the channel region extending perpendicularly with respect to the semiconductor substrate.

8. The semiconductor device according to claim 1, wherein the second gate metal layer contacts three sides of the end portion of the channel region extending perpendicularly with respect to the semiconductor substrate.

9. The semiconductor device according to claim 1, further comprising a spacer layer disposed on the gate structure and on the second gate metal layer.

10. The semiconductor device according to claim 1, wherein the second gate metal layer has a vertical height the same or substantially the same as a vertical height of the gate structure.

11. A semiconductor device, comprising:
a fin disposed on and extending perpendicularly with respect to a semiconductor substrate;
a bottom source/drain region disposed adjacent a base of the fin;
a top source/drain region disposed on the fin;
a gate structure disposed on the bottom source/drain region and around part of the fin, wherein the gate structure comprises a dielectric layer contacting the fin and a first gate metal layer disposed on the dielectric layer; and
a second gate metal layer disposed around an end portion of fin, wherein the second gate metal layer contacts the end portion of the fin.

12. The semiconductor device according to claim 11, further comprising a spacer layer disposed on the bottom source/drain region, wherein the second gate metal layer is disposed directly on the spacer layer.

13. The semiconductor device according to claim 12, wherein the gate structure is disposed on the spacer layer.

14. The semiconductor device according to claim 11, wherein the gate structure further comprises a work function metal layer disposed between the dielectric layer and the first gate metal layer.

15. The semiconductor device according to claim 11, wherein the second gate metal layer comprises the same material as the first gate metal layer.

16. The semiconductor device according to claim 11, wherein the second gate metal layer comprises a different material from the first gate metal layer.

17. The semiconductor device according to claim 11, wherein the second gate metal layer contacts sides of the end portion of the fin extending perpendicularly with respect to the semiconductor substrate.

18. The semiconductor device according to claim 11, wherein the second gate metal layer contacts three sides of the end portion of the fin extending perpendicularly with respect to the semiconductor substrate.

19. The semiconductor device according to claim 11, further comprising a spacer layer disposed on the gate structure and on the second gate metal layer.

20. The semiconductor device according to claim 11, wherein the second gate metal layer has a vertical height the same or substantially the same as a vertical height of the gate structure.

* * * * *